United States Patent
Noma (10) Patent No.: US 10,236,437 B2
(45) Date of Patent: Mar. 19, 2019

(54) MAGNETIC MEMORY DEVICE

(71) Applicant: Toshiba Memory Corporation, Minato-ku, Tokyo (JP)

(72) Inventor: Kenji Noma, Yokohama (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/211,184

(22) Filed: Jul. 15, 2016

(65) Prior Publication Data

US 2016/0329487 A1 Nov. 10, 2016

Related U.S. Application Data

(63) Continuation of application No. 14/020,562, filed on Sep. 6, 2013, now abandoned.

(60) Provisional application No. 61/842,840, filed on Jul. 3, 2013.

(51) Int. Cl.
*H01L 43/02* (2006.01)
*H01L 43/08* (2006.01)
*H01L 27/22* (2006.01)

(52) U.S. Cl.
CPC ............ *H01L 43/02* (2013.01); *H01L 27/228* (2013.01); *H01L 43/08* (2013.01)

(58) Field of Classification Search
CPC ......... G11C 11/15; G11C 11/22; G11C 11/14; H01L 43/02
USPC ........ 365/173, 171, 157, 158, 145; 265/171, 265/158; 257/421
See application file for complete search history.

(56) References Cited

U.S. PATENT DOCUMENTS

| | | | |
|---|---|---|---|
| 2002/0041515 A1* | 4/2002 | Ikeda ..................... | B82Y 10/00 365/158 |
| 2002/0067581 A1* | 6/2002 | Hiramoto ............... | B82Y 10/00 360/322 |
| 2002/0086182 A1* | 7/2002 | Fujikata ................. | B82Y 10/00 428/811.1 |
| 2004/0263303 A1 | 12/2004 | Kuriyama et al. | |
| 2005/0030138 A1 | 2/2005 | Higuchi et al. | |
| 2006/0203539 A1* | 9/2006 | Ikeda ..................... | B82Y 10/00 365/158 |
| 2012/0088125 A1* | 4/2012 | Nishiyama ............. | B82Y 25/00 428/828 |
| 2012/0309131 A1* | 12/2012 | Bando ............... | H01L 23/49503 438/118 |
| 2013/0069184 A1* | 3/2013 | Aikawa .................. | H01L 43/08 257/421 |

* cited by examiner

*Primary Examiner* — Mouloucoulaye Inoussa
(74) *Attorney, Agent, or Firm* — Holtz, Holtz & Volek PC (57) ABSTRACT

A magnetic memory device includes a semiconductor substrate; a magnetoresistive element provided on the semiconductor substrate. The magnetoresistive element includes a storage layer, a tunnel barrier layer, and a reference layer which are stacked, the reference layer having a magnetization direction perpendicular to a principal surface of the semiconductor substrate. The magnetic memory device further includes a magnetic field generation section provided away from the magnetoresistive element and configured to generate a magnetic field perpendicular to the principal surface of the semiconductor substrate. The semiconductor substrate, the magnetoresistive element and the magnetic field generation section are integrated as one unit.

6 Claims, 12 Drawing Sheets

MAGNETIC MEMORY DEVICE

CROSS-REFERENCE TO RELATED APPLICATIONS

This application is a Continuation Application of U.S. Ser. No. 14/020,562, filed Sep. 6, 2013, which claims the benefit of U.S. Provisional Application No. 61/842,840, filed Jul. 3, 2013, the entire contents of both of which are incorporated herein by reference.

FIELD

Embodiments described herein relate generally to a magnetic memory device.

BACKGROUND

In a magnetic memory device using magnetoresistive elements (MTJ elements (magnetic tunnel junction elements) with perpendicular magnetization, a shift cancelling layer is provided to cancel a magnetic field from a reference layer which is applied to a storage layer. In this case, to reliably cancel the magnetic field applied to the storage layer, the shift cancelling layer needs to be thick.

However, when MTJ elements are miniaturized as a result of high integration of magnetic memory devices, processing (pattering) the MTJ elements is very difficult. This in turn makes production of magnetic memory devices with desired characteristics difficult.

Thus, a magnetic memory device has been desired which can exhibit desired characteristics in spite of the miniaturized MTJ elements.

DETAILED DESCRIPTION

In general, according to one embodiment, a magnetic memory device comprises: a semiconductor substrate, a magnetoresistive element provided on the semiconductor substrate and comprising a storage layer, a tunnel barrier layer, and a reference layer which are stacked, the reference layer having a magnetization direction perpendicular to a principal surface of the semiconductor substrate, and a magnetic field generation section provided away from the magnetoresistive element and configured to generate a magnetic field perpendicular to the principal surface of the semiconductor substrate to reduce a magnetic field from the reference layer which is applied to the storage layer.

Embodiments will be described below with reference to the drawings.

Embodiment 1

Figure 1:
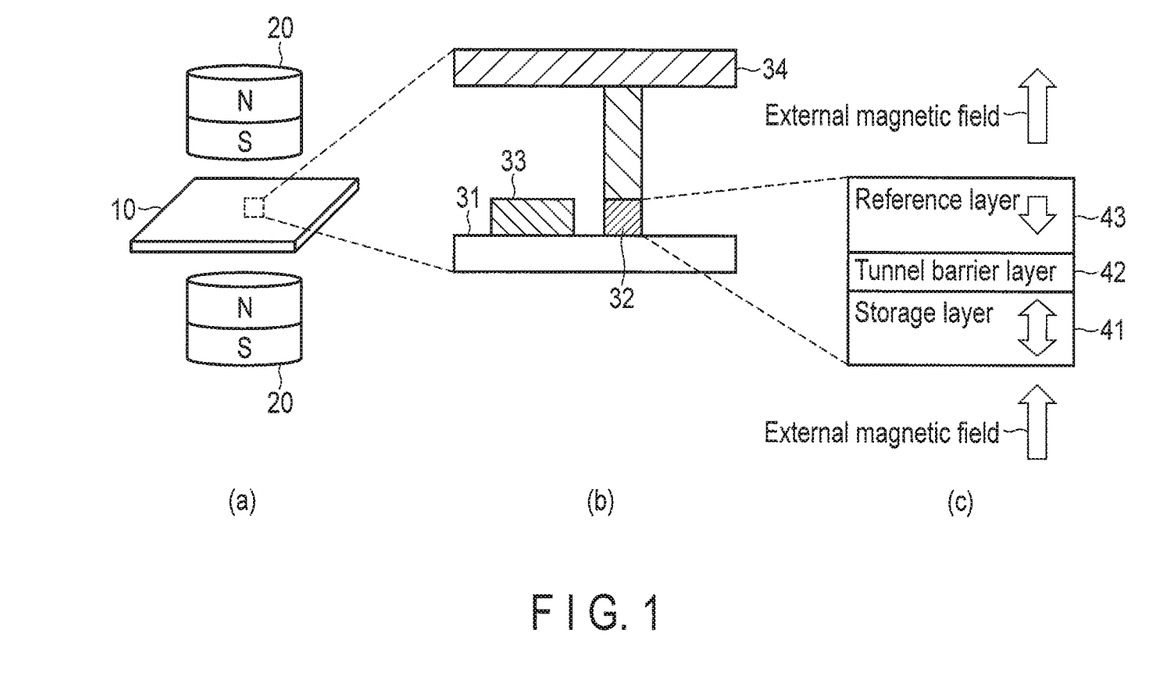
FIG. 1 is a diagram schematically showing a configuration of a magnetic memory device according to a first embodiment.

FIG. 1 is a diagram schematically showing a configuration of a magnetic memory device according to a first embodiment. FIG. 1(a) is a diagram schematically showing a general configuration of the magnetic memory device. FIG. 1(b) is a partly enlarged diagram of FIG. 1(a). FIG. 1(c) is a partly enlarged diagram of FIG. 1(b).

As shown in FIG. 1(a), magnetic field generation sections 20 are disposed on the respective opposite sides of a die 10 including a semiconductor substrate and a magnetoresistive element (MTJ element) according to the first embodiment. According to the first embodiment, the magnetic field generation sections 20 comprise permanent magnets.

As shown in FIG. 1(b), the die 10 includes a semiconductor substrate 31, a magnetoresistive element (MTJ element) 32, a word line 33, and a bit line 34. The MTJ element 32 is provided on the semiconductor substrate 31. However, the MTJ element 32 is normally not provided on the semiconductor substrate 31 but an insulating area is interposed between the semiconductor substrate 31 and the MTJ element 32. A select transistor (switching element (not shown in the drawings)) electrically connected to the MTJ element 32 is provided on a surface area of the semiconductor substrate 31. The select transistor selects the MTJ element 32. A gate electrode in the select transistor is a part of the word line 33.

As shown in FIG. 1(c), the MTJ element 32 has perpendicular magnetization and comprises a storage layer 41, a tunnel barrier layer 42, and a reference layer 43 which are stacked. In an illustrated example, the storage layer 41, the tunnel barrier layer 42, and the reference layer 43 are stacked in this order, but the order of stacking is not particularly limited. The reference layer 43 has a magnetization direction perpendicular to the principal surface of the semiconductor substrate 10. Information (0 or 1) is stored by making the magnetization direction in the storage layer 41 parallel or antiparallel to the magnetization direction in the reference layer 43.

The magnetic field generation section 20 will be described in further detail.

The magnetic field generation section 20 is provided away from the MTJ element 32 to generate a magnetic field perpendicular to the principal surface of the semiconductor substrate 31 to reduce a magnetic field from the reference layer 43 which is applied to the storage layer 41. That is, the magnetic field generation section (permanent magnet) 20 has magnetization perpendicular to the principal surface of the semiconductor substrate 31. More specifically, the magnetic field generation section 20 functions to generate a magnetic field that stabilizes the magnetization direction in the storage layer 41 when the magnetization direction in the storage layer 41 and the magnetization direction in the reference layer 43 need to maintain an antiparallel state. That is, a fundamental function of the magnetic field generation section 20 is not to cancel a leakage magnetic field from the reference layer 43 but to reduce the magnetic field from the reference layer 43 which is applied to the storage layer 41 to stabilize the magnetization direction in the storage layer 41.

The magnetic field generation section 20 is formed of a magnetic material containing, as a main component, at least one selected from a Co—Cr alloy, an Sm—Co alloy, a Co—Pt alloy, an Fe—Pt alloy, an Nd—Fe alloy, an Mn—Al alloy, an Al—Ni—Co alloy, a Ba ferrite oxide, and a Co ferrite oxide. Such a magnetic material has high magnetic anisotropy and exerts a strong magnetic force. This enables an effective reduction in the magnetic field from the reference layer 43 which is applied to the storage layer 41.

Furthermore, in the illustrated example, the magnetic field generation section 20 is disposed on each of the opposite sides of the die 10 but is allowed to be disposed on only one side of the die 10. In particular, the magnetic field generation section 20, the storage layer 41, the tunnel barrier layer 42, and the reference layer 43 are preferably arranged in this order from the lowermost layer to the uppermost layer or from the uppermost layer to the lowermost layer. That is, preferably, the storage layer 41 is provided between the magnetic field generation section 20 and the reference layer 43, and the tunnel barrier layer 42 is provided between the storage layer 41 and the reference layer 43. When the magnetic field generation section 20 and the reference layer 43 are arranged across the storage layer 41, the magnetic field from the reference layer 43 which is applied to the storage layer 41 can be effectively canceled by the magnetic field from the magnetic field generation section 20 which is applied to the storage layer 41.

As described above, the first embodiment comprises the magnetic field generation section 20 aside from the MTJ element 32. Thus, the external magnetic field from the magnetic field generation section 20 enables an effective reduction in the magnetic field from the reference layer 43 which is applied to the storage layer 41 without a thick shift cancelling layer. Therefore, a magnetic memory device with desired characteristics can be easily obtained in spite of miniaturized MTJ elements. Furthermore, a strong magnetic field with high magnetic anisotropy can be generated by using such a magnetic material as described above for the magnetic field generation section 20. This provides an excellent magnetic field generation section 20 and enables a magnetic memory device with desired characteristics to be easily obtained. Additionally, the need for a shift cancelling layer may be eliminated, enabling the MTJ element to be easily processed (patterned).

Embodiment 2

Figure 2:
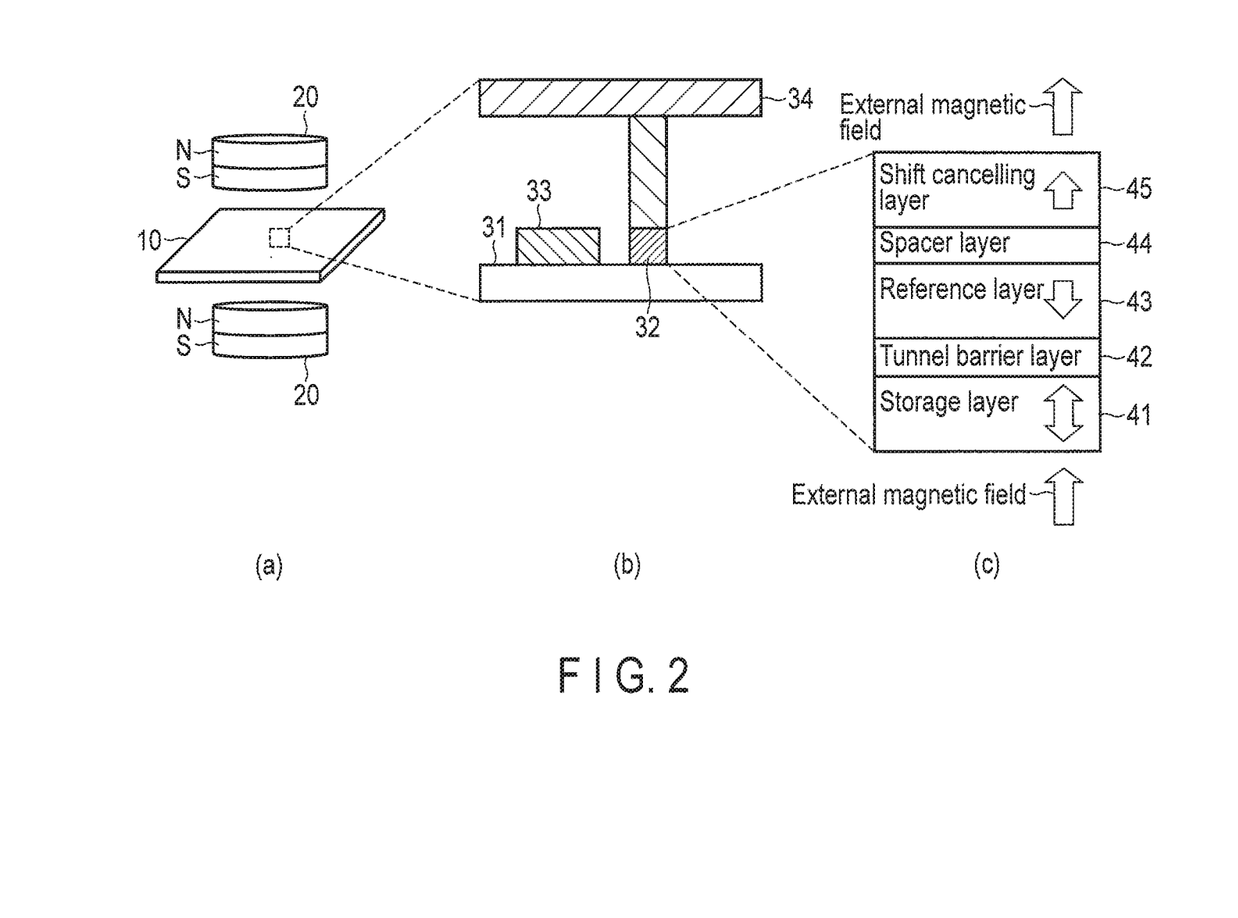
FIG. 2 is a diagram schematically showing a configuration of a magnetic memory device according to a second embodiment.

FIG. 2 is a diagram schematically showing a configuration of a magnetic memory device according to a second embodiment. FIG. 2(a) is a diagram schematically showing a general configuration of the magnetic memory device. FIG. 2(b) is a partly enlarged diagram of FIG. 2(a). FIG. 2(c) is a partly enlarged diagram of FIG. 2(b). The basic configuration of the magnetic memory device is similar to the basic configuration according to the first embodiment, and the matters described in the first embodiment will not be described below. The magnetic material used for the magnetic field generation section is also similar to the magnetic material according to the first embodiment.

According to the second embodiment, the MTJ element 32 comprises the storage layer 41, the tunnel barrier layer 42, the reference layer 43, a spacer layer 44, and the shift cancelling layer 45. As is the case with the first embodiment, the stacking order of these layers is not particularly limited. Furthermore, as is the case with the first embodiment, the magnetic field generation section 20 is allowed to be disposed on only one side of the die 10. In this case, preferably, the storage layer 41 is provided between the magnetic field generation section 20 and the reference layer 43, and the tunnel barrier layer 42 is provided between the storage layer 41 and the reference layer 43.

Like the first embodiment, the second embodiment comprises the magnetic field generation section 20 to enable an effective reduction in the magnetic field from the reference layer 43 which is applied to the storage layer 41. Thus, a magnetic memory device with desired characteristics can be easily obtained. Furthermore, although the second embodiment comprises the shift cancelling layer 45, the provision of the magnetic field generation section 20 allows a reduction in the thickness of the shift cancelling layer 45, enabling the MTJ element to be easily processed (patterned).

Embodiment 3

Figure 3:
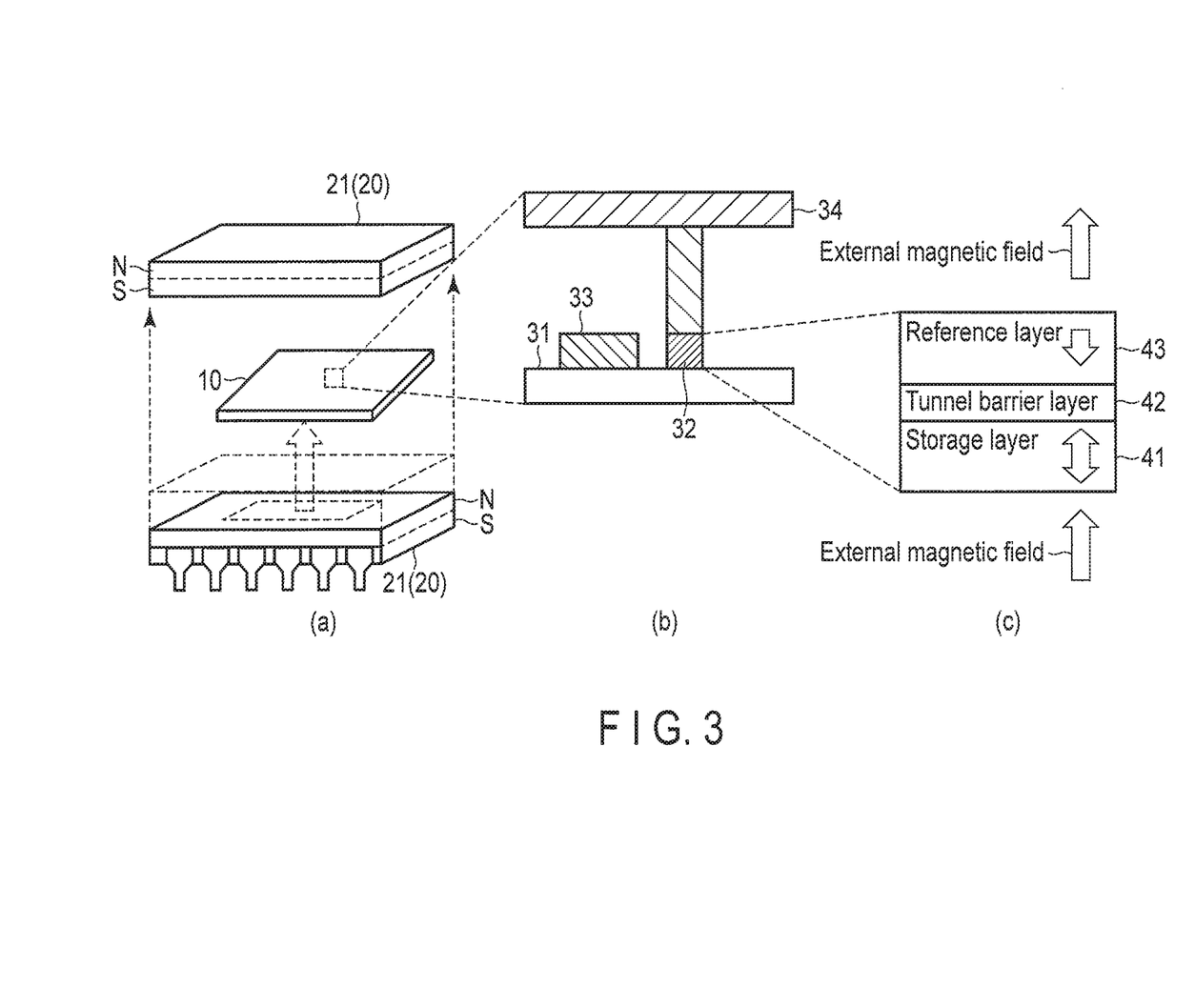
FIG. 3 is a diagram schematically showing a configuration of a magnetic memory device according to a third embodiment.

FIG. 3 is a diagram schematically showing a configuration of a magnetic memory device according to a third embodiment. FIG. 3(a) is a diagram schematically showing a general configuration of the magnetic memory device.

FIG. 3(*b*) is a partly enlarged diagram of FIG. 3(*a*). FIG. 3(*c*) is a partly enlarged diagram of FIG. 3(*b*). The basic configuration of the magnetic memory device is similar to the basic configuration according to the first embodiment, and the matters described in the first embodiment will not be described below. The magnetic material used for the magnetic field generation section is also similar to the magnetic material according to the first embodiment.

According to the third embodiment, a package 21 for the die 10 has a function to generate a magnetic field perpendicular to the principal surface of the semiconductor substrate 31 which function is otherwise provided by the magnetic field generation section 20. The remaining part of the basic configuration of the third embodiment is similar to the corresponding part according to the first embodiment.

Like the first embodiment, the third embodiment comprises the magnetic field generation section 20 to enable an effective reduction in the magnetic field from the reference layer 43 which is applied to the storage layer 41. Thus, a magnetic memory device with desired characteristics can be easily obtained. Furthermore, according to the third embodiment, the package 21 has the function of the magnetic field generation section 20, and thus, the material of the package 21 may be changed. The third embodiment therefore enables a magnetic memory device to be easily formed.

Embodiment 4

Figure 4:
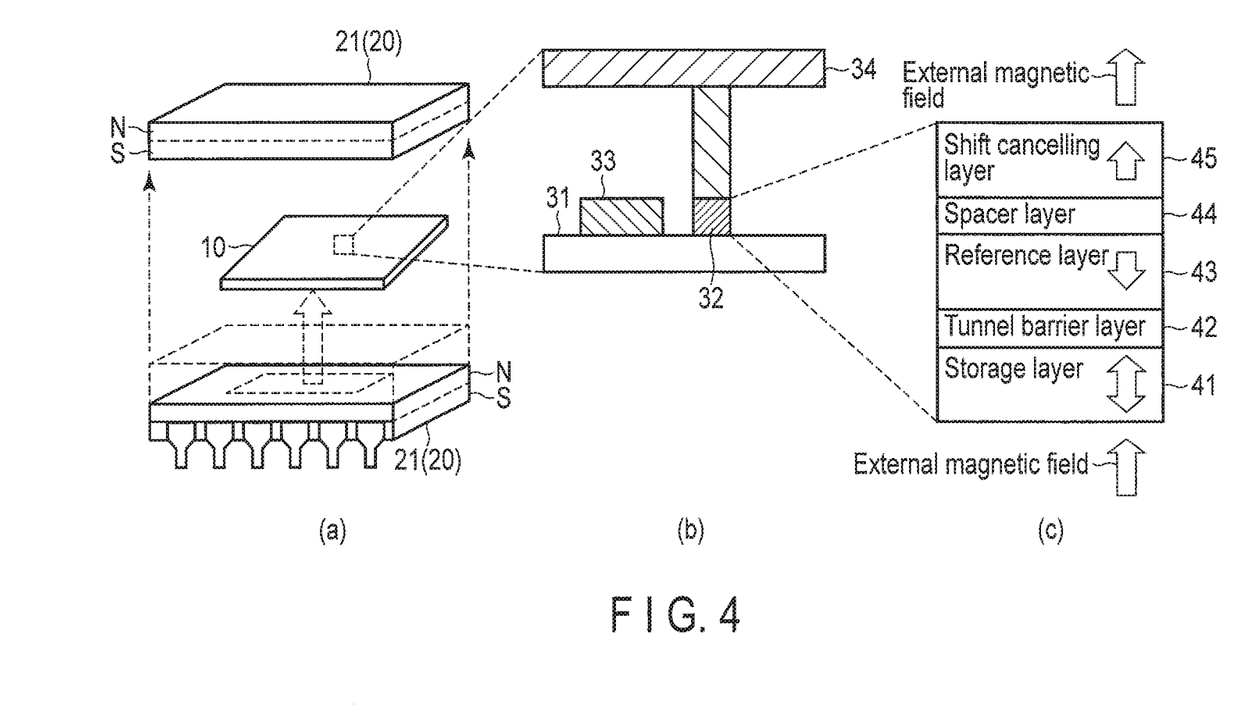
FIG. 4 is a diagram schematically showing a configuration of a magnetic memory device according to a fourth embodiment.

FIG. 4 is a diagram schematically showing a configuration of a magnetic memory device according to a fourth embodiment. FIG. 4(*a*) is a diagram schematically showing a general configuration of the magnetic memory device. FIG. 4(*b*) is a partly enlarged diagram of FIG. 4(*a*). FIG. 4(*c*) is a partly enlarged diagram of FIG. 4(*b*). The basic configuration of the magnetic memory device is similar to the basic configuration according to the first embodiment, and the matters described in the first embodiment will not be described below. The magnetic material used for the magnetic field generation section is also similar to the magnetic material according to the first embodiment.

According to the fourth embodiment, the configuration in FIG. 4(*a*) and FIG. 4(*b*) is similar to the configuration in FIG. 3(*a*) and FIG. 3(*b*) according to the third embodiment. The configuration in FIG. 4(*c*) is similar to the configuration in FIG. 2(*c*) according to the second embodiment.

Thus, the fourth embodiment can exert effects similar to the effects described in the first, second, and third embodiments.

Embodiment 5

Figure 5:
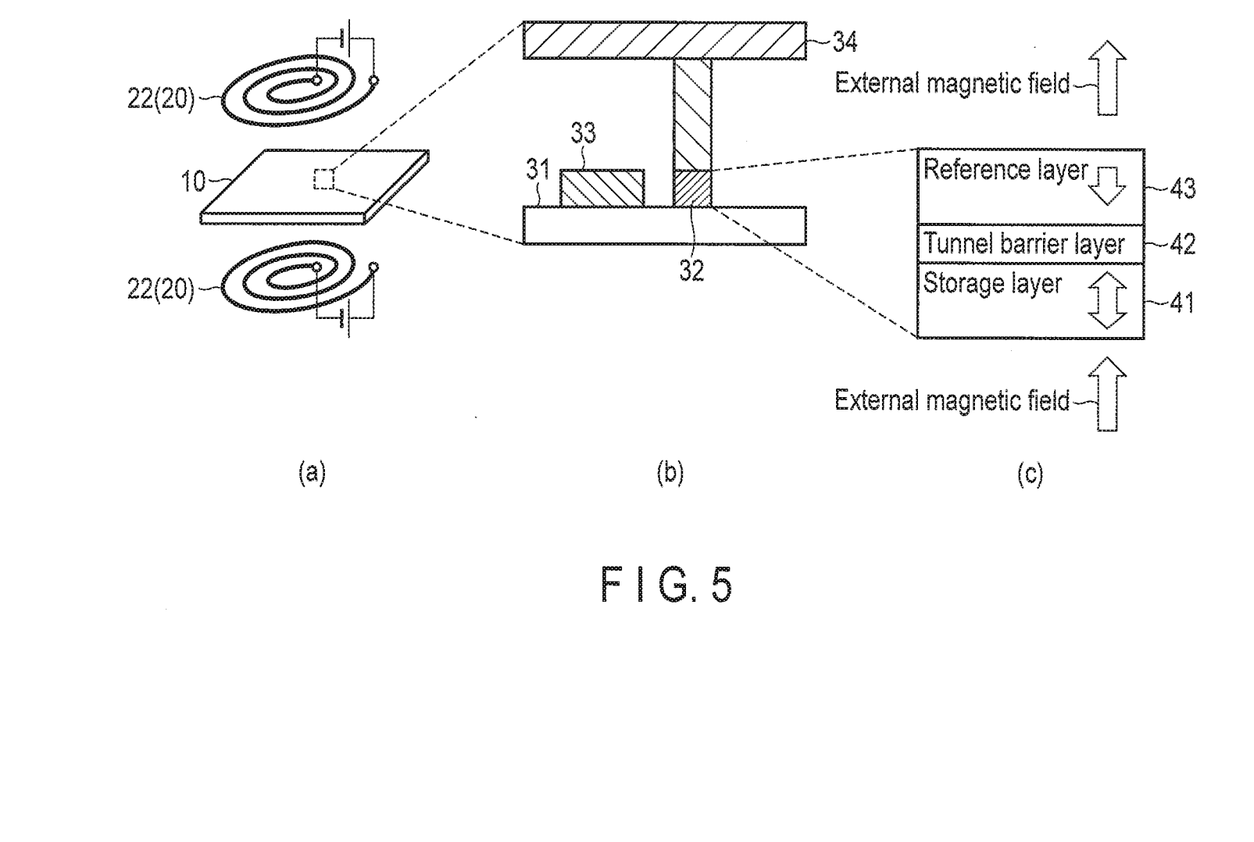
FIG. 5 is a diagram schematically showing a configuration of a magnetic memory device according to a fifth embodiment.

FIG. 5 is a diagram schematically showing a configuration of a magnetic memory device according to a fifth embodiment. FIG. 5(*a*) is a diagram schematically showing a general configuration of the magnetic memory device. FIG. 5(*b*) is a partly enlarged diagram of FIG. 5(*a*). FIG. 5(*c*) is a partly enlarged diagram of FIG. 5(*b*). The basic configuration of the magnetic memory device is similar to the basic configuration according to the first embodiment, and the matters described in the first embodiment will not be described below.

According to the fifth embodiment, an electromagnet 22 forms the magnetic field generation section 20 generating a magnetic field perpendicular to the principal surface of the semiconductor substrate 31. That is, a current is passed through an electromagnetic coil forming the electromagnet 22 to generate a magnetic field antiparallel to the direction of the magnetic field generated by the reference layer 43.

Like the first embodiment, the fifth embodiment comprises the magnetic field generation section 20 to enable an effective reduction in the magnetic field from the reference layer 43 which is applied to the storage layer 41. Thus, a magnetic memory device with desired characteristics can be easily obtained. Furthermore, according to the fifth embodiment, the magnetic field generation section 20 comprises the electromagnet 22. Thus, adjustment of a current flowing through the electromagnetic coil allows adjustment of the intensity of a magnetic field generated by the electromagnet 22, thus enabling the desired magnetic field intensity to be obtained.

Embodiment 6

Figure 6:
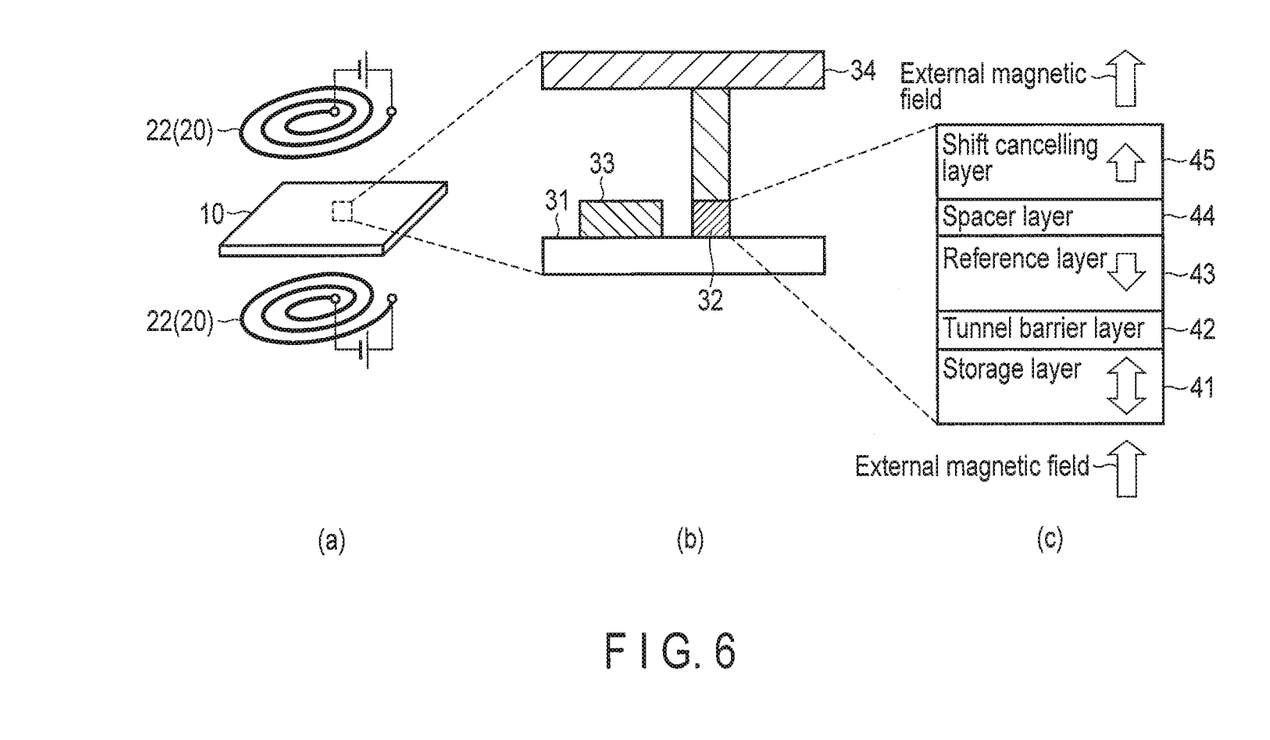
FIG. 6 is a diagram schematically showing a configuration of a magnetic memory device according to a sixth embodiment.

FIG. 6 is a diagram schematically showing a configuration of a magnetic memory device according to a sixth embodiment. FIG. 6(*a*) is a diagram schematically showing a general configuration of the magnetic memory device. FIG. 6(*b*) is a partly enlarged diagram of FIG. 6(*a*). FIG. 6(*c*) is a partly enlarged diagram of FIG. 6(*b*). The basic configuration of the magnetic memory device is similar to the basic configuration according to the first embodiment, and the matters described in the first embodiment will not be described below.

According to the sixth embodiment, the configuration in FIG. 6(*a*) and FIG. 6(*b*) is similar to the configuration in FIG. 5(*a*) and FIG. 5(*b*) according to the fifth embodiment. The configuration in FIG. 6(*c*) is similar to the configuration in FIG. 2(*c*) according to the second embodiment.

Thus, the sixth embodiment can exert effects similar to the effects described in the first, second, and fifth embodiments.

Now, the results of evaluation of element characteristics exhibited by the configurations illustrated in the first to sixth embodiments.

Figure 7:
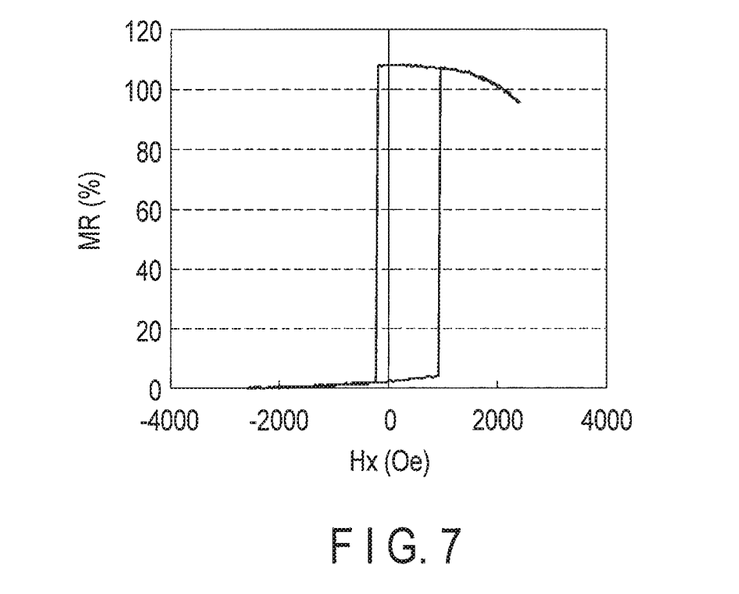
FIG. 7 is a diagram showing characteristics of an MTJ element exhibited when a magnetic field generation section applies an external magnetic field to the MTJ element.
Figure 8:
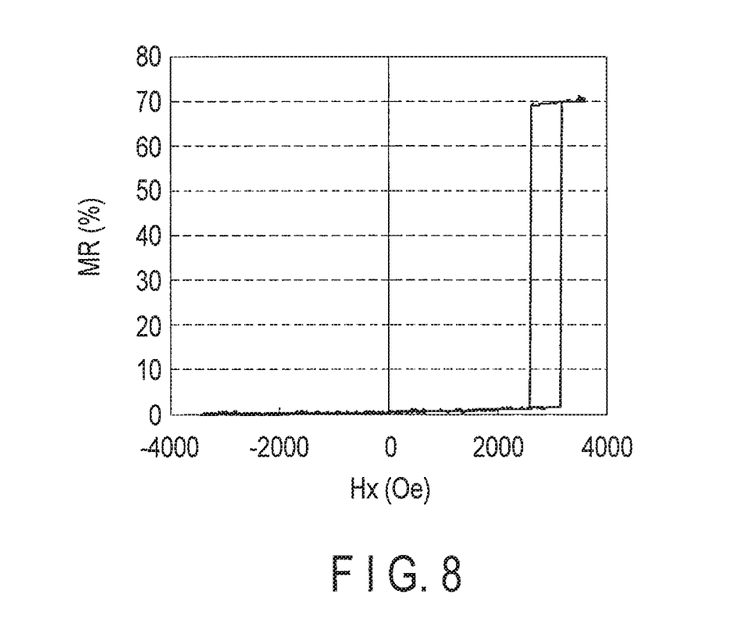
FIG. 8 is a diagram showing characteristics of the MTJ element exhibited when the magnetic field generation section applies no external magnetic field to the MTJ element.

FIG. 7 is a diagram showing characteristics of the MTJ element 32 with perpendicular magnetization which are exhibited when the magnetic field generation section 20 applies an external magnetic field to the MTJ element 32. FIG. 8 is a diagram showing characteristics of the MTJ element 32 with perpendicular magnetization which are exhibited when the magnetic field generation section 20 applies no external magnetic field to the MTJ element 32.

As shown in FIG. 8, when no external magnetic field is applied to the MTJ element 32, element resistance MR is constantly low at an operating point Hx=0 (Oe). This is because the magnetization direction in the storage layer is constantly parallel to the magnetization direction in the reference layer. Thus, even when a write is performed on the MTJ element to make the magnetization direction in the storage layer antiparallel to the magnetization direction in the reference layer, the magnetization direction in the storage layer returns to the parallel state when the write is finished. In contrast, when an external magnetic field was applied to the MTJ element (in the present example, a 3-kOe magnetic field was applied), such characteristics as shown in FIG. 7 were obtained. That is, at the operating point Hx=0 (Oe), both the parallel state (low resistance state) and the antiparallel state (high resistance state) can be stably established, resulting in stable memory operations.

Figure 9:
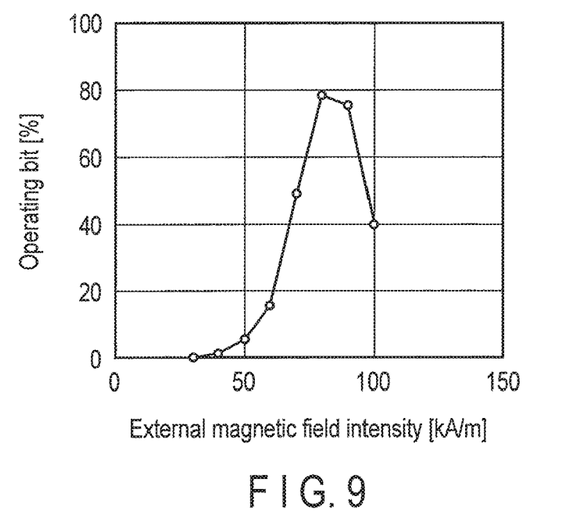
FIG. 9 is a diagram showing the rate of normally operating bits in the MTJ element.

FIG. 9 is a diagram showing the rate of normal operating bits. Specifically, FIG. 9 shows the rate of bits operating normally when MTJ elements were arranged in an array and a current write was performed on each of the elements eight times. Yield was 0% when no external magnetic field was applied but increased consistently with the intensity of an external magnetic field. When the external magnetic field was 80 {kA/m}, 78% of the elements operated.

The above-described results indicate that the element characteristics are improved when the magnetic field generation section 20 applies an external magnetic field to the MTJ element 32 with perpendicular magnetization.

Embodiment 7

Figure 10:
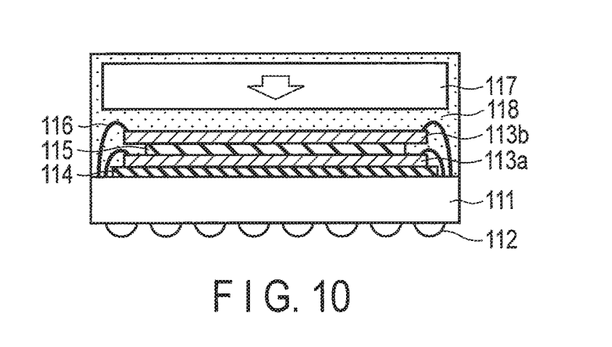
FIG. 10 is a diagram schematically showing a configuration of a magnetic memory device according to a seventh embodiment.

FIG. 10 is a diagram schematically showing a configuration of a magnetic memory device according to a seventh embodiment. The seventh embodiment relates to a more specific configuration of such a magnetic memory device as described in the first to sixth embodiments.

According to the seventh embodiment, a magnetic field generation section with perpendicular magnetization is included in a member that assembles dies (chips) each including a semiconductor substrate and magnetoresistive element (MTJ element).

As shown in FIG. 10, a plurality of dies (chips) 113a and 113b is stacked on a base substrate 111 with electrodes 112 provided thereon. Specifically, the base substrate 111 and the die 113a are bonded together by an adhesion film 114. The die 113a and the die 113b are bonded together by a die attach film (DAF) 115. A bonding wire 116 is provided between the base substrate 111 and the die 113a and between the base substrate 111 and the die 113b. Furthermore, a magnet 117 is provided over the die 113b. The above-described elements are covered with a mold material 118.

In the example illustrated in FIG. 10, the magnet 117 is used as a magnetic field generation section. However, at least one of the adhesion film 114 and the DAF 115 may be provided with the function of the magnetic field generation section. Specifically, the adhesion member such as the adhesion film 114 or the DAF 115 may be provided with magnetism by being mixed with a magnetic material.

Figure 11:
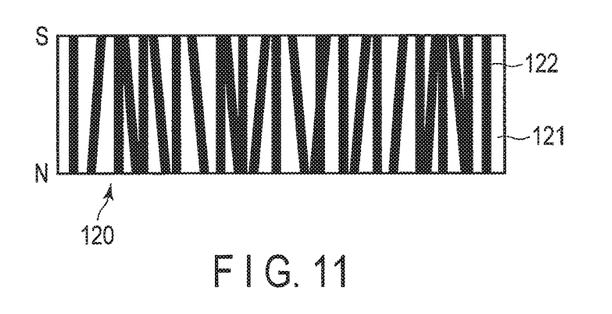
FIG. 11 is a diagram schematically showing a configuration of an adhesion member according to the seventh embodiment.

FIG. 11 is a diagram schematically showing a configuration of an adhesion member such as an adhesion film or a DAF. An adhesion member 120 contains a binder 121 and magnetic particles (acicular particles) 122. In this case, a longitudinal direction of the magnetic particles 122 is perpendicular to the principal surface of the semiconductor substrate.

Figure 12:
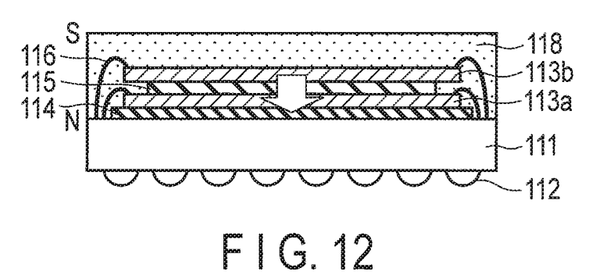
FIG. 12 is a diagram schematically showing a configuration of a magnetic memory device according to a modification of the seventh embodiment.

FIG. 12 is a diagram schematically showing a configuration of a magnetic memory device according to a modification of the seventh embodiment. The basic configuration of the modification is similar to the configuration shown in FIG. 10. Thus, components of this magnetic memory device similar to corresponding components shown in FIG. 10 are denoted by the same reference numerals and will not be described in detail.

According to the modification, the mold material 118 is provided with the function of the magnetic field generation section. Specifically, magnetic particles are mixed into a mold resin.

Figure 13:
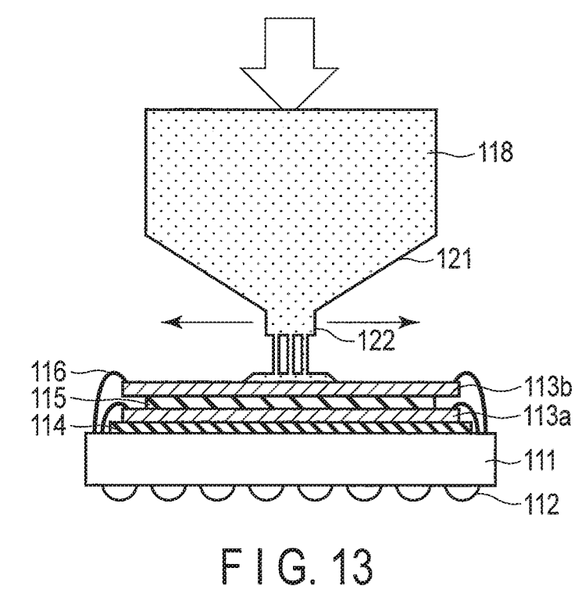
FIG. 13 is a diagram schematically showing a method for manufacturing a magnetic memory device according to the modification of the seventh embodiment.

FIG. 13 is a diagram schematically showing a manufacturing method according to the modification. The dies 113a and 113b are stacked on the base substrate 111 and then coated with the mold material 118 containing a mold resin mixed with magnetic particles (acicular particles). Specifically, the mold material 118 is placed in a container 121 and then pressurized so as to be ejected through a nozzle 122. The elongated nozzle 122 allows the direction in which the mold material 118 is ejected to be made parallel to the longitudinal direction of the magnetic particles. This allows the longitudinal direction of the magnetic particles 122 to be made perpendicular to the principal surface of the semiconductor substrate. When the mold material 118 is ejected through the nozzle 122, scanning the nozzle 122 allows the whole stack structure of the dies 113a and 113b to be coated with the mold material 118.

Thus, according to the seventh embodiment and the modification thereof, the member that assembles the dies (chips) is provided with the function of the magnetic field generation section. Thus, like the first embodiment, the seventh embodiment and the modification thereof enable an effective reduction in the magnetic field from the reference layer which is applied to the storage layer. As a result, a magnetic memory device with desired characteristics can be easily obtained.

Embodiment 8

Figure 14:
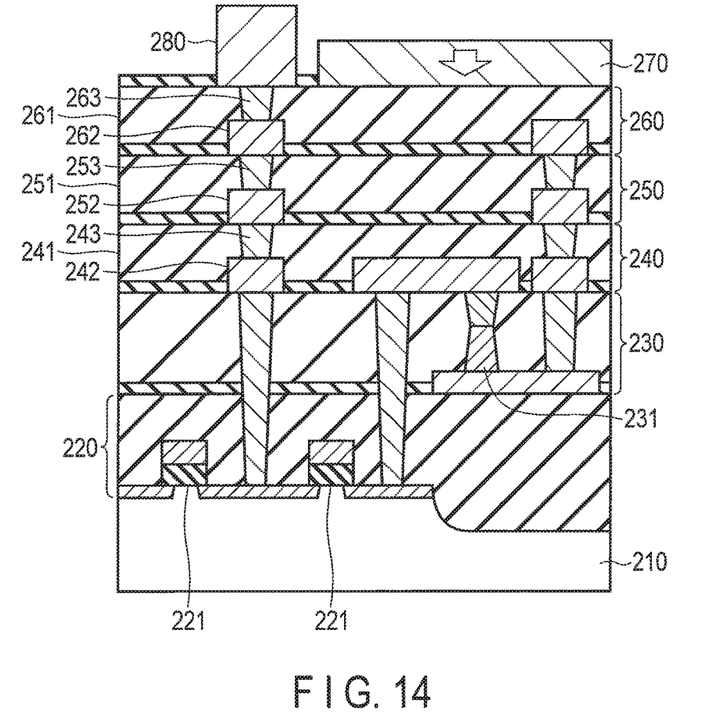
FIG. 14 is a diagram schematically showing a configuration of a magnetic memory device according to an eighth embodiment.

FIG. 14 is a diagram schematically showing a configuration of a magnetic memory device according to an eighth embodiment. The eighth embodiment relates to a more specific configuration of such a magnetic memory device as described in the first to sixth embodiments.

According to the eighth embodiment, at least one interconnection layer is provided on a semiconductor substrate, and a magnetic field generation section with perpendicular magnetization is provided on the at least one interconnection layer.

An FEOL area 220 is provided on a semiconductor substrate 210, and a transistor 221 and the like are formed in the FEOL area 220. A cell area 230 is provided on the FEOL area 220. An MTJ element 231 and the like are formed in the cell area 230. The MTJ element 231 is electrically connected to the transistor 221. Furthermore, the MTJ element 231 is electrically connected to an interconnection in interconnection layers described below.

Interconnect layers 240, 250, and 260 are provided on the cell area 230. An interlayer insulating film 241, an interconnection 242, and a plug 243 are formed in the interconnection layer 240. An interlayer insulating film 251, an interconnection 252, and a plug 253 are formed in the interconnection layer 250. An interlayer insulating film 261, an interconnection 262, and a plug 263 are formed in the interconnection layer 260.

A magnetic field generation section 270 and a pad 280 are provided on the interconnection layer 260. The magnetic field generation section 270 is formed of a magnetic material layer with perpendicular magnetization perpendicular to the principal surface of the semiconductor substrate 210. The magnetic material layer is formed using a method, for example, sputtering, vacuum deposition, plating, or CVD (chemical vapor deposition).

As described above, the eighth embodiment also comprises the magnetic field generation section with perpendicular magnetization. Thus, like the first embodiment, the eighth embodiment enables an effective reduction in the magnetic field from the reference layer which is applied to the storage layer. This allows a magnetic memory device with desired characteristics to be easily obtained.

Embodiment 9

Figure 15A:
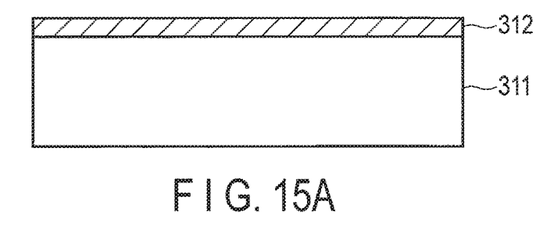
FIG. 15A diagram schematically showing a part of a method for manufacturing a magnetic memory device according to a ninth embodiment.
Figure 15B:
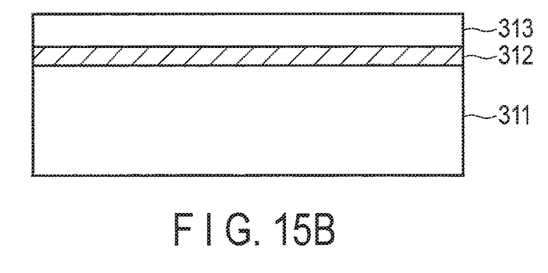
FIG. 15B diagram schematically showing a part of the method for manufacturing a magnetic memory device according to the ninth embodiment.

FIG. 15A and FIG. 15B are diagrams schematically showing a method for manufacturing a magnetic memory device according to a ninth embodiment. The ninth embodiment relates to a more specific configuration of such a magnetic memory device as described in the first to sixth embodiments.

According to the ninth embodiment, a magnetic field generation section with perpendicular magnetization is provided in a semiconductor substrate and parallel to a principal surface of the semiconductor substrate.

First, as shown in FIG. 15A, a magnetic material layer 312 such as Co is formed on a silicon substrate 311 by sputtering. According to the ninth embodiment, the magnetic material layer 312 functions as a magnetic field generation section.

Then, as shown in FIG. 15B, a silicon layer 313 is formed on the magnetic material layer 312 by CVD. Thus, a semiconductor substrate with an SOM (Silicon On Magnet) structure is obtained.

The subsequent steps are not shown in the drawings. A transistor, an MTJ element, and the like are formed on the silicon layer 313. The configurations of the transistor, the MTJ element, and the like are similar to, for example, the configurations in FIG. 1 to FIG. 6.

As described above, the ninth embodiment also comprises the magnetic field generation section with perpendicular magnetization. Thus, like the first embodiment, the ninth embodiment enables an effective reduction in the magnetic field from the reference layer which is applied to the storage layer. This allows a magnetic memory device with desired characteristics to be easily obtained.

Figure 16A:
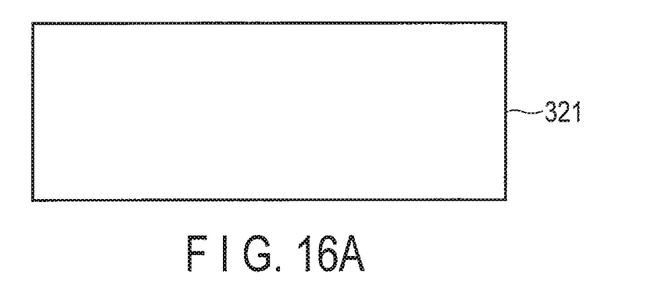
FIG. 16A diagram schematically showing a part of a method for manufacturing a magnetic memory device according to a first modification of the ninth embodiment.
Figure 16B:
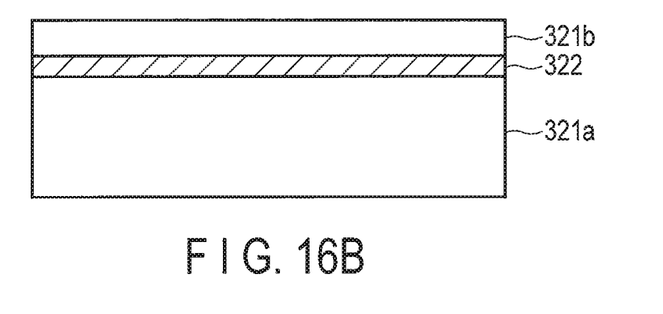
FIG. 16B diagram schematically showing a part of the method for manufacturing a magnetic memory device according to the first modification of the ninth embodiment.

FIG. 16A and FIG. 16B are diagrams schematically showing a method for manufacturing a magnetic memory device according to a first modification of the ninth embodiment.

First, as shown in FIG. 16A, a silicon substrate 321 is prepared.

Then, as shown in FIG. 16B, magnetic material ions such as Co ions are implanted into the silicon substrate 321. As a result, a magnetic material layer 322 is formed in the silicon substrate 321. According to the first modification, the magnetic material layer 322 functions as a magnetic field generation section. The silicon substrate 321 is partitioned into a lower area 321a and an upper area 321b, and thus forms a semiconductor substrate with an SOM structure.

The subsequent steps are not shown in the drawings. A transistor, an MTJ element, and the like are formed on the upper layer 321b of the silicon substrate 321. The configurations of the transistor, the MTJ element, and the like are similar to, for example, the configurations in FIG. 1 to FIG. 6.

As described above, the first modification also comprises the magnetic field generation section with perpendicular magnetization. Thus, like the first embodiment, the first modification enables an effective reduction in the magnetic field from the reference layer which is applied to the storage layer. This allows a magnetic memory device with desired characteristics to be easily obtained.

Figure 17A:
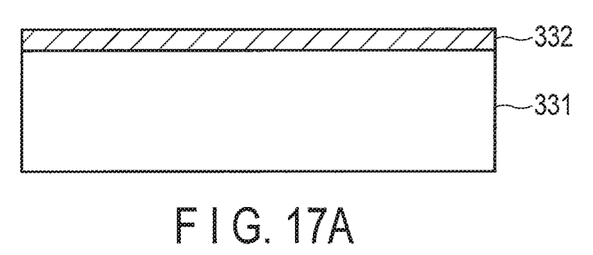
FIG. 17A diagram schematically showing a part of a method for manufacturing a magnetic memory device according to a second modification of the ninth embodiment.
Figure 17B:
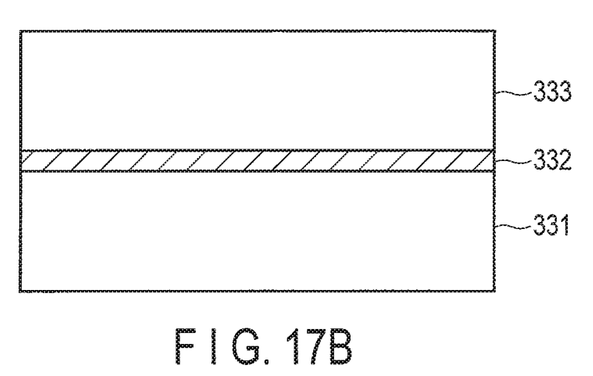
FIG. 17B diagram schematically showing a part of the method for manufacturing a magnetic memory device according to the second modification of the ninth embodiment.
Figure 17C:
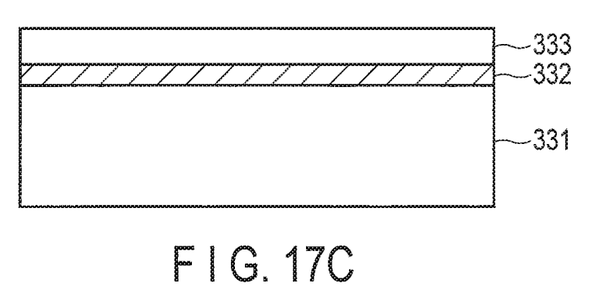
FIG. 17C diagram schematically showing a part of the method for manufacturing a magnetic memory device according to the second modification of the ninth embodiment.

FIG. 17A, FIG. 17B, and FIG. 17C are diagrams schematically showing a method for manufacturing a magnetic memory device according to a second modification of the ninth embodiment.

First, as shown in FIG. 17A, a magnetic material layer 332 such as Co is formed on a silicon substrate 331 by sputtering. According to the second modification, the magnetic material layer 332 functions as a magnetic field generation section.

Then, as shown in FIG. 17B, a second silicon substrate 333 is placed on the magnetic material layer 332 and pressurized and thus joined to the second magnetic material layer 332.

Then, the second silicon substrate 333 is polished and thus thinned. Hence, a semiconductor substrate with an SOM structure is obtained.

The subsequent steps are not shown in the drawings. A transistor, an MTJ element, and the like are formed on the second silicon substrate 333. The configurations of the transistor, the MTJ element, and the like are similar to, for example, the configurations in FIG. 1 to FIG. 6.

As described above, the second modification also comprises the magnetic field generation section with perpendicular magnetization. Thus, like the first embodiment, the second modification enables an effective reduction in the magnetic field from the reference layer which is applied to the storage layer. This allows a magnetic memory device with desired characteristics to be easily obtained.

In the eighth and ninth embodiments, each of the magnetic field generation sections (magnetic material layers 270, 312, 322, and 332) may be separated into a plurality of rectangular portions by lattice-shaped spaces. The separation into the plurality of portions enables an increase in the intensity of the magnetic field applied to the magnetic field MTJ element. Preferably, each of the rectangular portions of the magnetic material layer is square, and the length of each side of the rectangular portion ranges from a value equal to the thickness of the magnetic material layer up to a value several times as large as the thickness. Furthermore, the length of each side of the rectangular portion is preferably larger than the space width of the space between adjacent rectangular portions.

A general architecture that implements the various features of the embodiments will now be described with reference to the drawings. The drawings and the associated descriptions are provided to illustrate the embodiments and not to limit the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising:
   a semiconductor substrate;
   a magnetoresistive element provided on the semiconductor substrate and comprising a storage layer, a tunnel barrier layer, and a reference layer which are stacked, the reference layer having a magnetization direction perpendicular to a principal surface of the semiconductor substrate; and
   a magnetic field generation section provided away from the magnetoresistive element and formed of a magnetic material containing, as a main component, at least one selected from a Co—Cr alloy, an Sm—Co alloy, a Co—Pt alloy, an Fe—Pt alloy, an Nd—Fe alloy, an Mn—Al alloy, an Al—Ni—Co alloy, a Ba ferrite oxide, and a Co ferrite oxide,
   wherein the semiconductor substrate, the magnetoresistive element and the magnetic field generation section are integrated as one unit, and
   wherein the magnetic field generation section comprises at least one of an adhesion member, a mold material, and a package for a die, the die including the semiconductor substrate and the magnetoresistive element.

2. The device of claim 1, wherein the storage layer is provided between the magnetic field generation section and the reference layer, and the tunnel barrier layer is provided between the storage layer and the reference layer.

3. The device of claim 1, wherein the magnetoresistive element comprises a shift cancelling layer further stacked to the storage layer, the tunnel barrier layer and the reference layer.

4. A magnetic memory device comprising:
a semiconductor substrate;
a magnetoresistive element provided on the semiconductor substrate and comprising a storage layer, a tunnel barrier layer, and a reference layer which are stacked, the reference layer having a magnetization direction perpendicular to a principal surface of the semiconductor substrate; and
a magnetic field generation section provided away from the magnetoresistive element and configured to generate a magnetic field perpendicular to the principal surface of the semiconductor substrate,
wherein the semiconductor substrate, the magnetoresistive element and the magnetic field generation section are integrated as one unit, and
wherein the magnetic field generation section comprises at least one of an adhesion member mixed with a magnetic material, and a mold material including magnetic particles mixed into a mold resin.

5. The device of claim 4, wherein the storage layer is provided between the magnetic field generation section and the reference layer, and the tunnel barrier layer is provided between the storage layer and the reference layer.

6. The device of claim 4, wherein the magnetoresistive element comprises a shift cancelling layer further stacked to the storage layer, the tunnel barrier layer and the reference layer.

* * * * *